(12) United States Patent
Brankovic et al.

(10) Patent No.: US 6,748,203 B1
(45) Date of Patent: Jun. 8, 2004

(54) THREE PORT STRUCTURE WITH MODULATED LO SIGNAL

(75) Inventors: Veselin Brankovic, Esslingen (DE); Dragan Krupezevic, Stuttgart (DE); Gerald Oberschmidt, Bruchsal (DE); Tino Konschak, Stuttgart (DE); Thomas Dölle, Stuttgart (DE); Hamid Amir-Alikhani, Leonberg (DE); Masayoshi Abe, Kanagawa-ken (JP)

(73) Assignees: Sony International (Europe) GmbH, Berlin (DE); Sony Corporation, Tokyo (JP)

(*) Notice: Subject to any disclaimer, the term of this patent is extended or adjusted under 35 U.S.C. 154(b) by 504 days.

(21) Appl. No.: 09/672,643

(22) Filed: Sep. 28, 2000

(30) Foreign Application Priority Data

Sep. 29, 1999  (EP) .............................. 99119326

(51) Int. Cl.[7] .............................. H04B 1/06; H04B 1/26
(52) U.S. Cl. ...................... 455/259; 455/318; 455/334; 455/323; 455/255; 455/258; 455/113
(58) Field of Search .................... 455/323, 324, 455/325, 259, 318, 258, 255, 326, 113, 116, 334

(56) References Cited

U.S. PATENT DOCUMENTS

| | | | | |
|---|---|---|---|---|
| 4,237,556 A | * | 12/1980 | Naito | ......................... 455/154 |
| 5,465,409 A | * | 11/1995 | Borras et al. | ............... 455/260 |
| 6,507,733 B1 | * | 1/2003 | Krupezevic et al. | ........ 455/324 |

FOREIGN PATENT DOCUMENTS

WO       WO 99 33166       7/1999

* cited by examiner

*Primary Examiner*—Vivian Chin
*Assistant Examiner*—Eugene Yun
(74) *Attorney, Agent, or Firm*—Frommer Lawrence & Haug LLP; William S. Frommer; Dennis M. Smid

(57) ABSTRACT

A three port structure for the down conversion demodulation of a digitally modulated RF signal is proposed, wherein no RF switches are provided. The three port structure (1) has a first input (2) for the RF signal to be down converted and a second input (3) for a RF signal originating from a local oscillator (8). An output (4) of the three port structure (1) is supplied to a power sensor unit (5). The RF signal from the local oscillator (8) is modulated (7) before it is supplied to the three port structure (1).

16 Claims, 6 Drawing Sheets

Figure 3A:
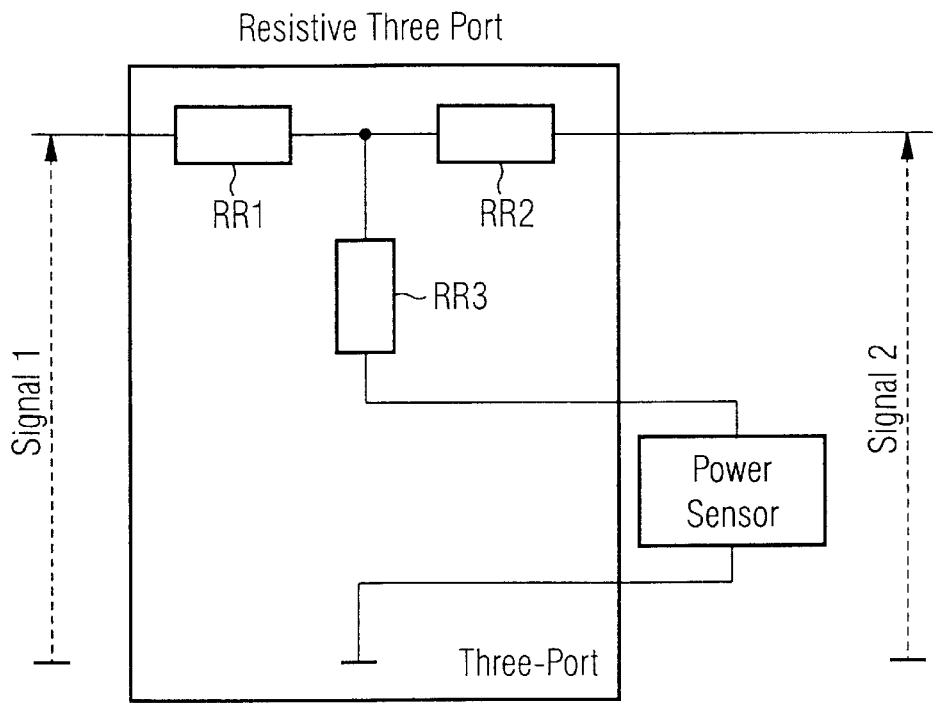
Figure 3B:
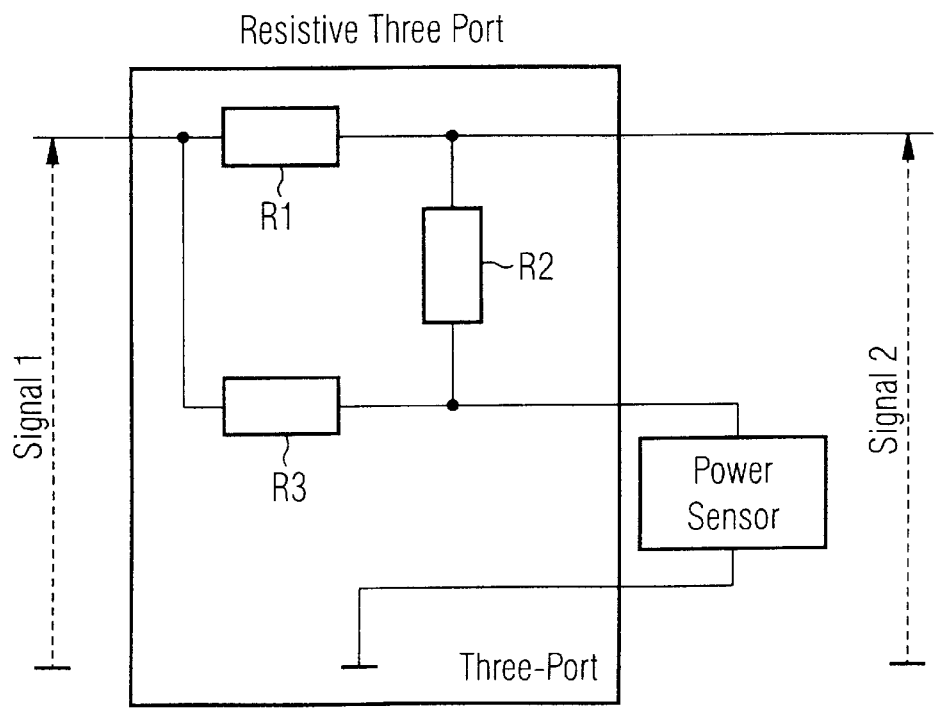
Figure 3C:
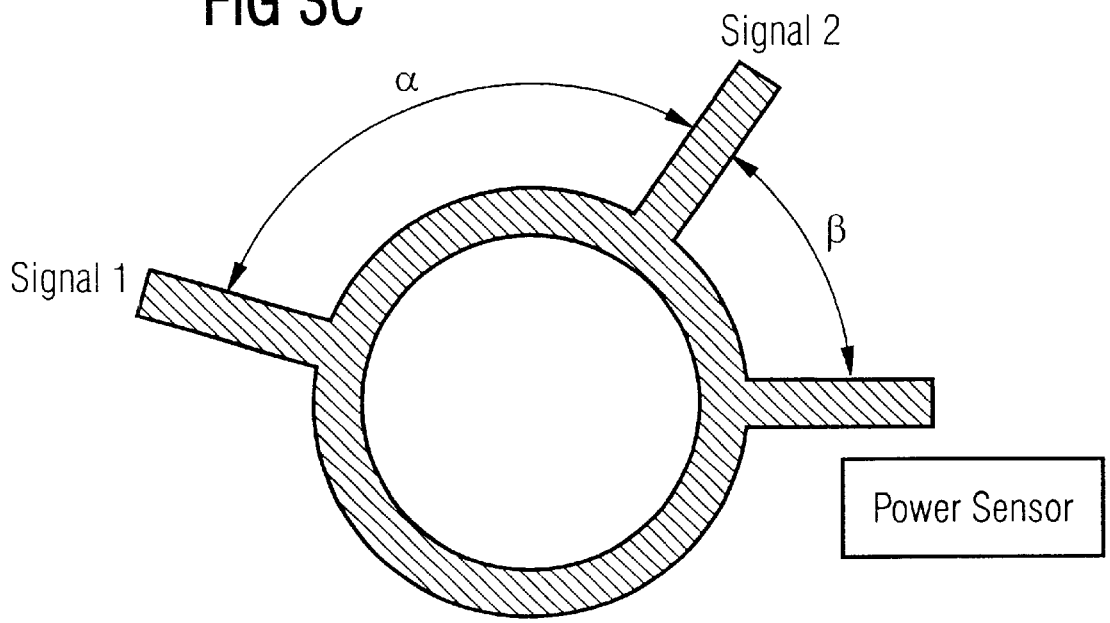
Figure 3D:
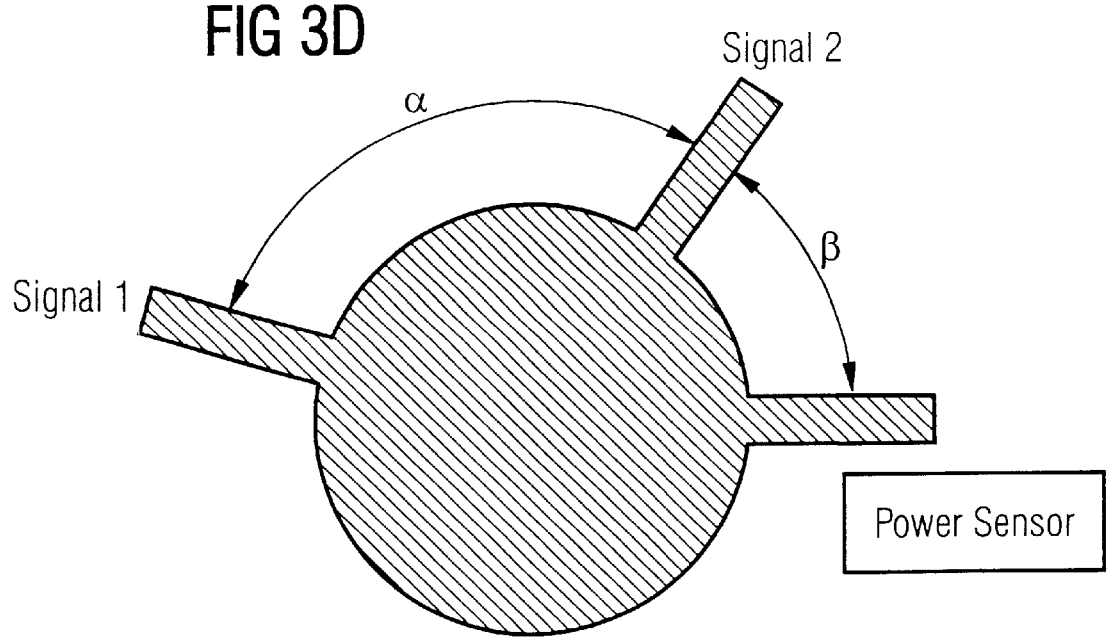
Figure 3E:
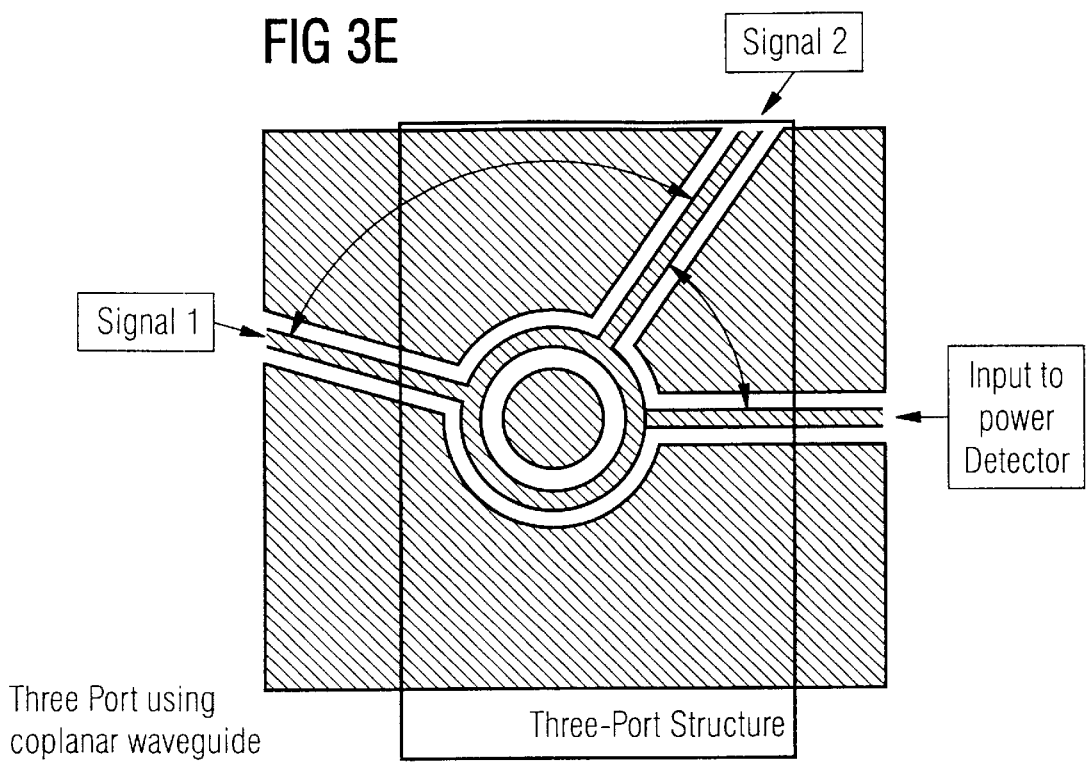
Figure 3F:
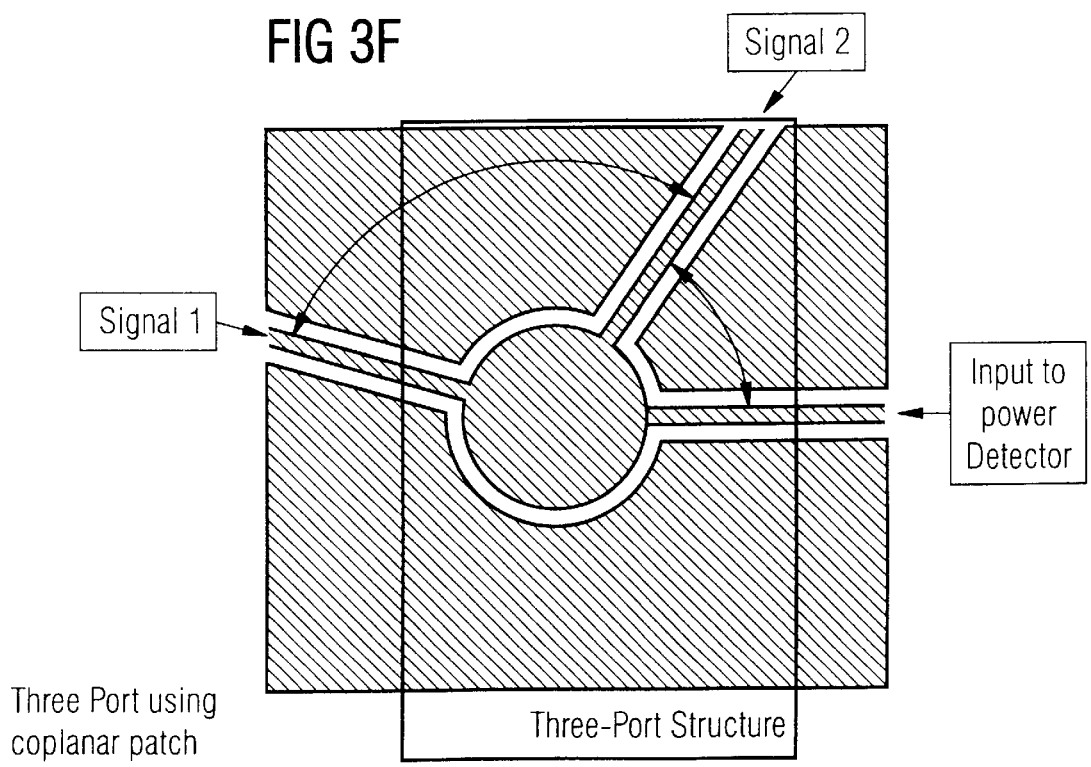

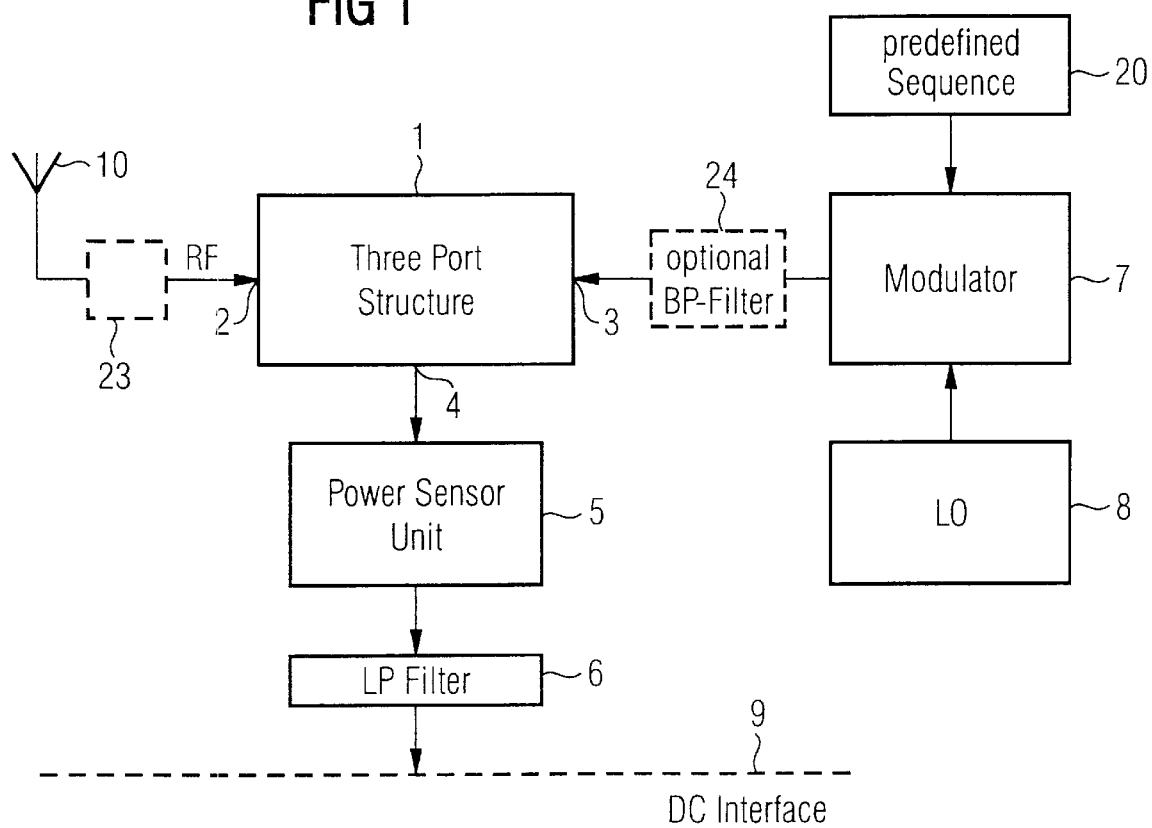
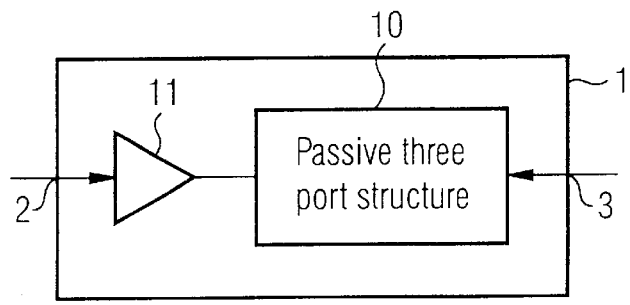

Three Port using microstrip line ring

Three Port using microstrip patch

Three Port using coplanar waveguide

Three Port using coplanar patch

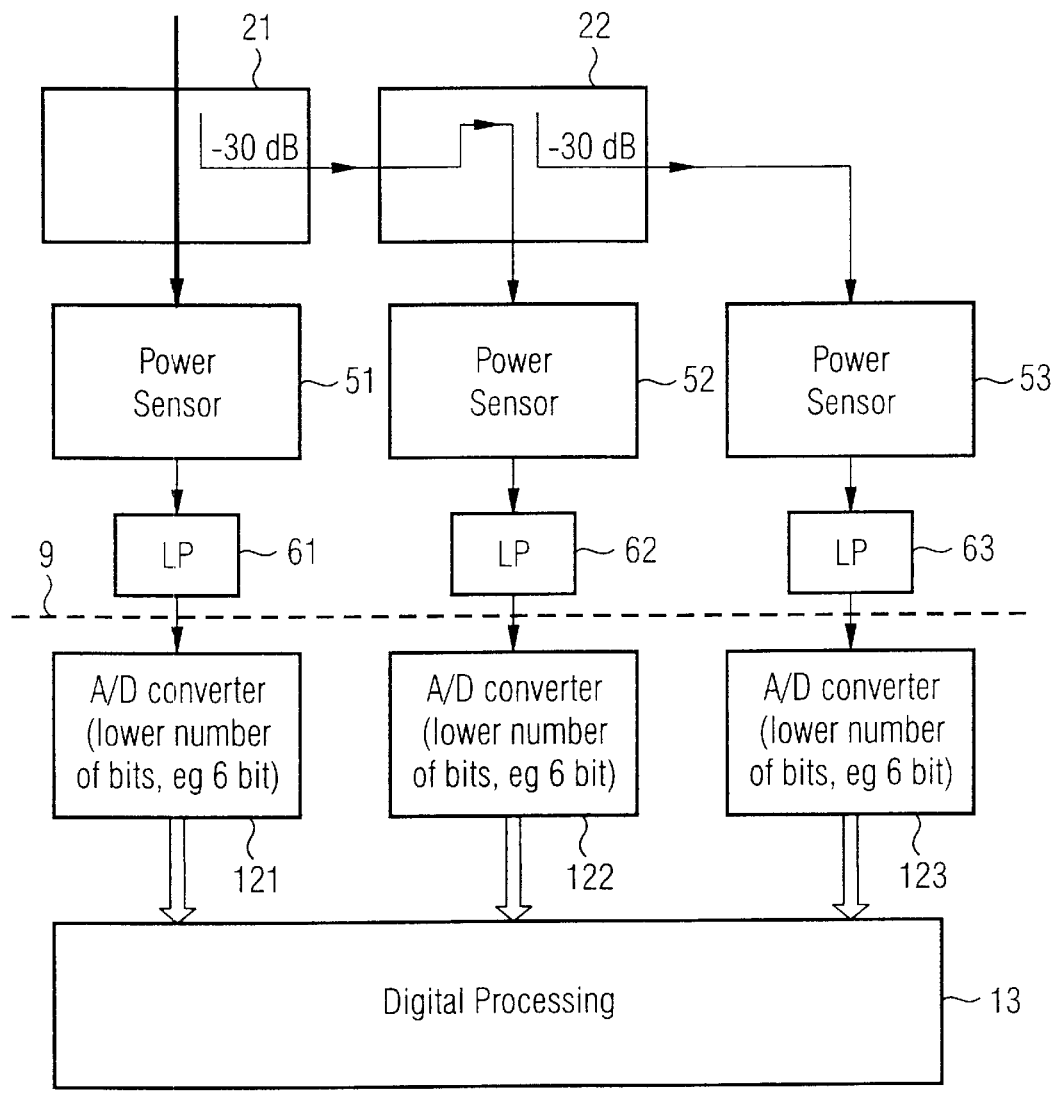

THREE PORT STRUCTURE WITH MODULATED LO SIGNAL

The present invention relates to a three port structure for the down conversion of a modulated RF signal, a RF receiver comprising such a three port structure, a mobile telecommunications device comprising such a three port structure as well as to a method for the down conversion of a modulated RF signal by means of a three port structure.

A three port structure is a particular case of n-port structures. In the following the state of the art particularly regarding six-port structures (n=6) will be explained.

A six-port receiver is known acting in a direct conversion manner and allowing conversion from mm-wave range and microwave range directly to the base band. The six-port receiver detects the relative phase and relative magnitude of two incoming RF-signals by using the information of superimposed RF signals. At the same time a classic I/Q-demodulation chip (digital or analog) can be avoided. By using suitable calibration procedures the influences of the non-ideal linear RF-components including manufacturing tolerances can be minimized. The circuitry of the six-port receiver is realized using only passive components in combination with power sensors for the detection of the relative phase and the relative magnitude of the RF-signals as shown in EP-A-0896455.

In Bossisio, Wu "A six-port direct digital millimeter wave receiver", Digest of 1994 IEEE MTT Symposium, vol. 3, page 1659–1662, San Diego, May 1994, a structure for a six-port receiver is proposed.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at at least three different ports. The imperfections of the hardware can be readily eliminated by an appropriate calibration procedure. Very accurate measurements can be made in a large dynamic range and wide frequency range. Six-port junction receivers consist of microwave components such as e.g. directional couplers and power dividers as well as power sensors. The circuit can be easily integrated as MHMIC or MMIC. The known receiver performs direct phase/amplitude demodulation at microwave and mm-wave frequencies.

By performing a calibration procedure the hardware imperfections can be readily eliminated. This significantly eases the requirement of the hardware implementation and enables the six-port receiver to operate over a wide band up to mm-wave frequencies.

According to the above cited document of Bossisio et. al. a six-port receiver concept with power dividers and 90 degrees hybrid circuits realized in distributed technology is used. The application of that known structure lies mainly in the frequency bands above 10 GHz, however, it suffers from an insufficient band width of the operation due to the inherently frequency selective nature of the 90 degree hybrid circuits.

From D. Maurin, Y. Xu, B. Huyart, K. Wu, M. Cuhaci, R. Bossisio "CPW Millimeter-Wave Six-Port Reflectometers using MHMIC and MMIC technologies", European Microwave Conference 1994, pp. 911–915, a wide-band topology for reflectometer used is known which is based on a distributing element approach featuring coplanar wave guide applications in the frequency range from 11 to 25 GHz.

From V. Bilik, et al. "A new extremely wideband lumped six-port reflectometer" European Microwave Conference 1991, pp. 1473–1477 and the idea of using Wheatstone Bridges and resistive structures for reflectometer applications is known.

From Li, G. Bossisio, K. Wu, "Dual tone Calibration of Six-Port Junction and its application to the six-port direct digital receiver", IEEE Transactions on Microwave Theory and Techniques, vol. 40, January 1996 a six-port reflectometer topology based on four 3dB hybrid circuits, power dividers and attenuators is known.

From U.S. Pat. No. 5,498,969 an asymmetrical topology for a reflectometer structure featuring one matched detector and three unmatched detectors is known.

From U.S. Pat. No. 4,521,728 with the title "Method and six-port network for use in determining complex reflection coefficients of microwave networks" a reflectometer six-port topology is known comprising two different quadrate hybrids, phase shifter, two power dividers and one directional coupler for which the realization by a microstrip line technology is disclosed.

From EP-A-0 805 561 a method for implementing a direct conversion receiver with a six-port junction is known. According to this known technique, modulated transmitted modulation is received by a direct conversion receiver which comprises a six-port junction. The demodulation is carried out analogically.

From EP-A-0 841 756 a correlator circuit for a six-port receiver is known. In this correlator circuit the received signal is summed up with a local oscillator signal at various phase angles, wherein the phase rotation between the local oscillator and RF signals is carried out separately from the summing of the correlator outputs.

A three port structure has particularly advantages due to its less complexity.

It is the object of the present invention to provide for a technique for further simplifying three port structures. Particularly the technique according to the invention should give the possibility to suppress any RF switches in the three port structure.

The object is achieved by means of the features of the independent claims. The dependent claims develop further the central idea of the present invention.

According to the invention therefore a three port structure for the down conversion of a modulated RF signal is provided. The three port structure has a first input being supplied with the RF signal to be down converted. A second input is provided for a RF signal originating from a local oscillator. An output of the three port structure supplies a signal representing a combination of the RF signals supplied to the first and second input to a power sensor unit. Between the local oscillator and the three port structure a modulator is provided such that the RF signal from the local oscillator is modulated according to a predetermined modulation scheme before it is supplied to the second input of the three port structure.

The modulator can be particularly designed to generate at least three different modulation states of a predetermined modulation scheme within the time duration of one modulation state of the RF signal to be down converted such that three different combination signals are output to the power sensor unit within the time duration of one modulation state of the RF signal to be down converted.

A processing unit can detect modulation states of the modulated RF signal supplied to the first input of the three port structure respectively on the basis of three different combination signals output by the three port structure during the time duration of one modulation state of the RF signal supplied to the first input of the three port structure.

The modulator can be designed to generate modulation states with at least two different amplitudes and phases.

The modulator can be designed to generate modulation states with equal amplitude and at least three different phase states (PSK modulation scheme).

A (non-reciprocal) RF/LO isolation unit can be provided in the three port structure for isolating the first and the second input port of the three port structure.

The power sensor unit can comprise a plurality of power sensors, wherein at least some of the power sensors have a power coupler at its input side having a coupling coefficient less than the dynamic range of the associated power sensor.

According to another aspect of the present invention a RF receiver comprising a three port structure as set forth above is provided.

According to a still further aspect of the present invention a mobile telecommunications device such as a mobile telephone is provided, wherein the mobile telecommunications device comprises a three port structure as set forth above.

According to a still further aspect of the present invention a method for the down conversion of a modulated RF signal by means of a three port structure is provided. A RF signal to be down converted is supplied to a first input of the three port structure. A RF signal originating from a local oscillator is supplied to a second input of the three port structure. The RF signals supplied to the first and second input are combined in the three port structure and a signal representing the result of the combination is output to a power sensor unit. The RF signal from the local oscillator thereby is modulated before it is supplied to the second input of the three port structure.

In the modulation step at least three different modulation states are generated according to a predetermined modulation scheme within the time duration of one modulation state of the RF signal to be down converted. Thereby three different combination signals are output to the power sensor unit within the time duration of one modulation state of the RF signal to be down converted.

The modulation states of the modulation RF signal supplied to the first input of the three port structure can be detected respectively on the basis of at least three different combination signals output by the three port structure during the time duration of one modulation state of the RF signal supplied to the first input of the three port structure.

In the modulation step modulation states with at least two different amplitudes and phases can be generated.

Alternatively, in the modulation step modulation steps with equal amplitude and at least three different phase states can be generated (PSK modulation scheme).

The first and the second input of the three port structure can be isolated to avoid a coupling from the RF signal supplied to the second input of the three port structure to the signal supplied to the first input.

Further advantages, features and objects of the present invention will be come clearer when reading the following detailed explanation of embodiments of the present invention taken in conjunction with the figures of the enclosed drawings.

Figure 5:
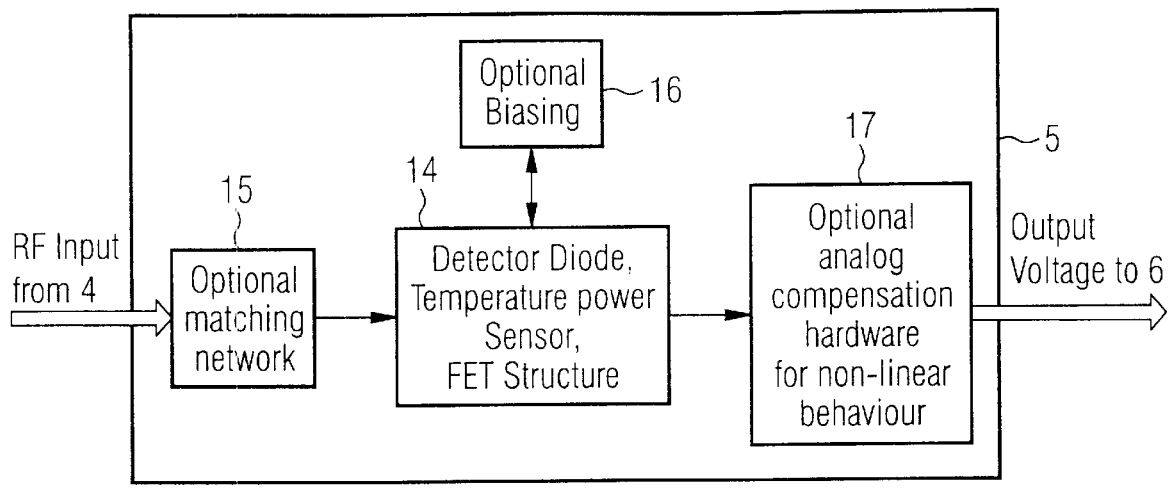
Figure 6:
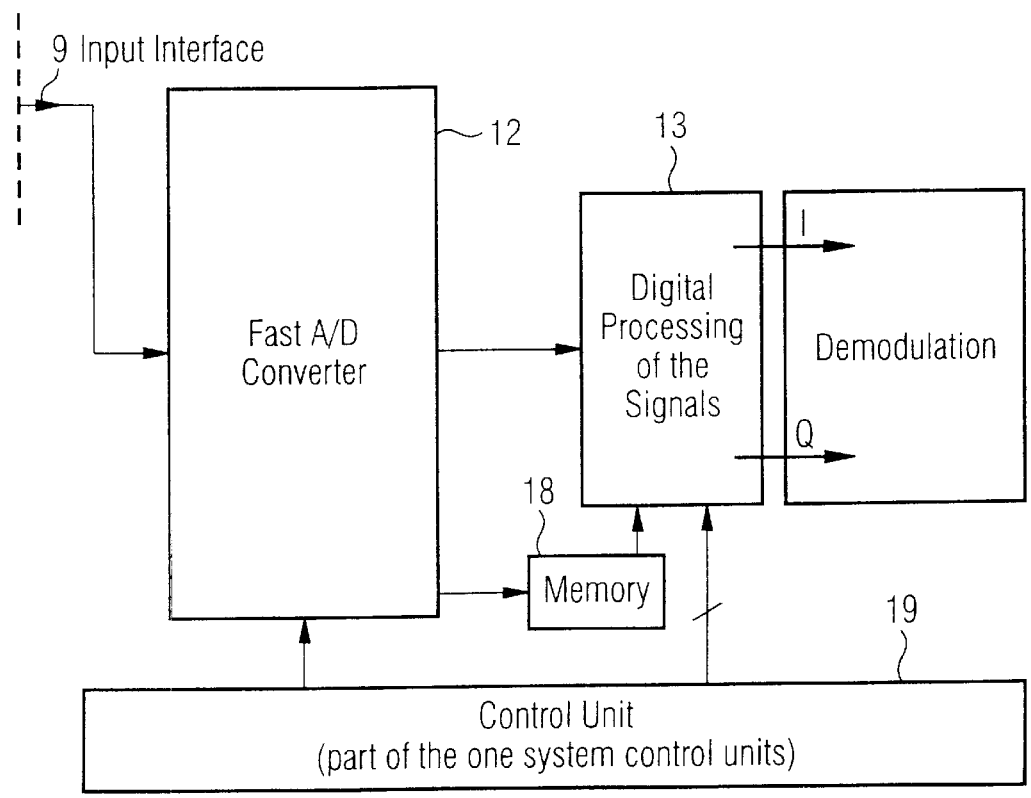

FIG. 1 shows a general representation of a three port structure of the present invention, FIG. 2 shows a general representation of the internal structure of a passive three port structure, FIG. 3 shows different implementation possibilities of a three port structure, FIG. 4 shows a possible implementation of a power sensor unit comprising a plurality of power sensors, FIG. 5 shows the internal structure of a power sensor, and FIG. 6 shows the processing following the DC interface.

With reference to FIG. 1 at first the general structure of a down conversion unit comprising a three port structure 1 will be explained.

A digitally modulated RF signal is input to a first input terminal 2 of the three port structure 1. The RF signal can be for example a digitally modulated, wirelessly transmitted RF signal which has been received by means of an antenna 10 after optionally having passed a down conversion block 23. The three port structure 1 furthermore comprises a second input terminal 3 as well as one output terminal 4. The RF signal supplied to the second input terminal 3 of the three port structure 1 is a modulated RF signal originating from a local oscillator 8. A band pass filter 24 can be provided between the modulator 7 and the three port structure 1. However, the RF signal from the modulator 7 can also be supplied directly to the second input terminal 3 of the three port structure 1.

The RF output signal of the local oscillator 8 is supplied to a modulator 7 which modulates a predefined sequence stored in a memory 20 according to a predetermined modulation scheme, such as for example PSK modulation. The modulated RF output signal of the modulator 7 is supplied to the second input terminal 3 of the three port structure 1.

As it is well known generally from the n-port technology, the three port structure 1 combines the RF signals supplied to the first and second input terminal 2 and 3, respectively. The output signal at the output terminal 4 represents a combination of these RF signals. The output signal at the output terminal 4 of the three port structure 1 is supplied to a power sensor unit 5 which can comprise one or a plurality of power sensors which are known from the state of the art. Each of the power sensors of the power sensor unit 5 a low pass filter 6 is provided. The output signal of the low pass filter(s) 6 is supplied to a DC interface 9. At the DC interface 9 processing units for detecting the modulation states of the down converted signal can be attached.

FIG. 2 shows an embodiment for a passive three port structure, according to which the passive three port structure 1 comprises the passive three port junction 10 and a RF/LO isolation unit 11 which provides for a non-reciprocal isolation of the first and second input terminal 2, 3.

FIG. 3 shows different implementation possibilities for a three port junction. FIG. 3a and FIG. 3b show resistive realisations. FIG. 3c shows a three port using a microstrip line ring. FIG. 3d shows a three port using a microstrip patch. FIG. 3e shows a three port using a coplanar waveguide and FIG. 3f shows a three port using a coplanar patch.

FIG. 4 shows an embodiment for the power sensor unit 5. According to this embodiment a plurality of power sensor 51, 52 and 53 is provided. With each of the power sensors 51, 52, 53 a low pass filter 61, 62 and 63, respectively, is associated. The filtered output signal of the low pass filter 61, 62, 63 is output to the DC interface 9. At the other side of the DC interface 9 a A/D converter 121, 122, 123 are attached supplying a A/D converted signal to a digital processing unit 13.

Regarding FIG. 4, the bit resolution number of the converters may be reduced when increasing the number of associated A/D converters.

As it is furthermore shown in FIG. 4, the first power sensor 51 receives the output signal of the three port structure with its original power, whereas for the second and third power sensor 52, 53 power couplers 21 and 22 are provided having a coupling coefficient (−30 dB) less than the dynamic range of the associated power sensors 52, 53.

FIG. 5 shows the internal structure of a power sensor. The power sensor 5 according to this embodiment comprises an optional matching network 15 at the input side, a power detecting device 14 such as a detector diode, a temperature power sensor and FET structure. Furthermore an optional biasing unit 16 as well as an optional analog compensation hardware for a non-linear behaviour of the power sensing device 14 can be provided.

FIG. 6 shows the digital processing attached to the DC interface 9. The analog, low pass filtered signal (S) supplied to the DC interface 9 are first A/D converted 12. The digitally converted signals are then digitally processed 13 to detect for example the I/Q modulation values or to perform a full demodulation.

As will be explained in detail later on, during each modulation state of the down converted RF signal at least three different combination signals are present at the output of the three port structure 1, such that the A/D converter 12 has to convert at least three analog signals within the time duration of a modulation state of said down converted RF signal. These at least three A/D converted values are stored in a memory 18, such that the digital processing unit 13 can detect I/Q values of the RF signal supplied to the first input 2 of the three port structure 1 on the basis of the at least three values stored in the memory 18.

The A/D converter 12 as well as the digital processing unit 13 is controlled by a control unit 19.

In the following the function of the technique according to the present invention will be explained.

As has already been explained the modulation speed of the modulated LO signal is at least three times higher as the modulation speed of the incoming RF signal to be down converted. Therefore, the power sensor unit 5 obtains at least three different combined signals in at least three successive time periods, in which the face of the modulated LO signal exhibits at least three different states, while the RF signal theoretically does not change. Some changes of the RF signal may be nearly caused by noise.

The symbol duration of the modulated RF signal (T) is (at least) three times longer than the duration of one modulation state of the LO signal (T/3). That means, during a symbol duration (T), three different signals are available at the power sensor assembly input. Each of these signals is related to a combination of one of the three different LO symbols and the RF symbol. The power sensor is working fast, so that it is able to detect the incoming power level during the time T/3, the duration of one LO state. The associated A/D (from FIG. 6) converter takes information about three power level states during symbol duration of T. All these (at least three) samples belonging to one modulation state of the received RF signal are stored.

Having (at least) three measurements of the power levels and knowing the LO power, it is possible to calculate the relative phase and relative magnitude of the RF signal related to the LO signals, or in other words I/Q values. Related background is presented in the following equations.

$$s_1 = S_2(I + jQ); \quad s_2 = S_2 e^{j[\theta]}; \quad [\theta] = [\theta_1 \theta_2 \theta_3] \quad (1)$$

$$v_n = k_1 s_1 + k_2 s_2 = S_2(k_1 I + k_2 \cos\theta_n + j(k_1 Q + k_2 \sin\theta_n)); n = 1, 2, 3 \quad (2)$$

$$P_0 = C \cdot |s_2|^2 = CS_2^2, \quad P_n = C \cdot |v_n|^2, n = 1, 2, 3 \quad (3)$$

$$P_n = P_0[k_1^2(I^2 + Q^2) + k_2^2 + 2k_1 k_2(I \cos\theta_n + Q \sin\theta_n)], n = 1, 2, 3 \quad (4)$$

-continued $$\frac{P_2 - P_1}{2k_1 k_2 P_0} = (\cos\theta_2 - \cos\theta_1)I + (\sin\theta_2 - \sin\theta_1)Q \quad (5)$$

$$\frac{P_3 - P_1}{2k_1 k_2 P_0} = (\cos\theta_3 - \cos\theta_1)I + (\sin\theta_3 - \sin\theta_1)Q \quad (6)$$

$$I = \frac{(\sin\theta_3 - \sin\theta_1)(P_2 - P_1) - (\sin\theta_2 - \sin\theta_1)(P_3 - P_1)}{2k_1 k_2 P_0[\sin(\theta_3 - \theta_2) + \sin(\theta_2 - \theta_1) + \sin(\theta_1 - \theta_3)]} \quad (7)$$

$$Q = \frac{(\cos\theta_1 - \cos\theta_3)(P_2 - P_1) - (\cos\theta_1 - \cos\theta_2)(P_3 - P_1)}{2k_1 k_2 P_0[\sin(\theta_3 - \theta_2) + \sin(\theta_2 - \theta_1) + \sin(\theta_1 - \theta_3)]} \quad (8)$$

In special case:

$$k_1 = k_2 = 1; \quad \theta = [\, 0° \quad 120° \quad -120°\,] \Rightarrow \quad (9)$$

$$I = \frac{2P_1 - P_2 - P_3}{6P_0} \quad (10)$$

$$Q = \frac{P_2 + P_3 - 2P_1}{2\sqrt{3}\, P_0} \quad (11)$$

| | |
|---|---|
| $s_1$ | RF signal to be I/Q demodulated |
| $s_2$ | Phase modulated LO (second RF signal), having constant amplitude and three states of phase, which are known |
| $\theta_n$ | three known phase states of LO, n = 1,2,3 |
| T | RF Symbol Duration (meaning signal does not change magnitude and phase during this time) |
| $\tau = T/3$ | Symbol Duration (constant Phase) of LO signal |
| $v_1$ | signal which approaches power sensor at time t = $t_0$ |
| $v_2$ | signal which approaches power sensor at time t = $t_0$ + T/3 |
| $v_3$ | signal which approaches power sensor at time t = $t_0$ + 2T/3 |
| $k_1$ | transfer function of the signal $s_1$ to the power detector |
| $k_2$ | transfer function of the signal $s_2$ to the power detector |
| C | real constant |
| $P_0$ | LO Power |
| $P_1$ | Power level detected after power detector, at time t = $t_0$ |
| $P_2$ | Power level detected after power detector, at time t = $t_0$ + T/3 |
| $P_3$ | Power level detected after power detector, at time t = $t_0$ + 2T/3 |

The invention therefore proposes a three port receiver technology without RF switches. The LO signal approaching the three port structure is already modulated by a known modulation, having a modulation sequence of at least three modulation states, wherein preferably all three modulation states have three different phases. The changing period of the LO modulation states is at least three times higher compared to the changes of the RF signal.

What is claimed is:

1. Three port structure for the down conversion of a modulated RF signal, the three port structure (1) having
   a first input being (2) supplied with the RF signal to be down converted,
   a second input (3) for a RF signal originating from a local oscillator (8), and
   an output (4) for supplying a signal representing a combination of the RF signals supplied to the first and second input to a power sensor unit (5),
   wherein a modulator (7) is provided for modulating the RF signal from the local oscillator (8) before supplying it to the second input (3) of the three port structure (1).

2. Three port structure according to claim 1, characterized in that
   the modulator (7) is designed to generate at least three different modulation states within the time duration of one modulation state of the RF signal to be down converted such that at least three different combination signals are output to the power sensor unit (5) within the time duration of one modulation state of the RF signal to be down converted.

3. Three port structure according to claim 2, characterized in that it comprises a processing unit (13) for detecting modulation states of the modulated RF signal supplied to the first input (2) of the three port structure (1) respectively on the basis of the at least three different combination signals output by the three port structure (1) during the time duration of one modulation state of the RF signal supplied to the first input (2) of the three port structure (1).

4. Three port structure according to claim 1, characterized in that the modulator (7) is designed to generate modulation states with at least two different amplitudes and phases.

5. Three port structure according to claim 1, characterized in that the modulator (7) is designed to generate modulation states with equal amplitude and at least three different phase states.

6. Three port structure according to claim 1, characterized in that it comprises a RF/LO isolation unit (11).

7. Three port structure according to claim 1, characterized in that the power sensor unit comprises:
a plurality of power sensors (51, 52, 53), wherein at least some of the power sensors have a power coupler at its input side having a coupling coefficient less than the dynamic range of the associated power sensor.

8. Three port structure according to claim 1, characterized in that a band pass filter (24) is provided between the modulator (7) and the three port structure (1).

9. RF receiver, characterized in that it comprises a three port structure according to claim 1.

10. Mobile telecommunications device, characterized in that it comprises a three port structure according to claim 1.

11. Method for the down conversion of a modulated RF signal by means of a three port structure (1), the method comprising the following steps:
supplying a RF signal to be down converted to a first input (2) of the three port structure (1),
supplying a RF signal originating from a local oscillator (8) to a second input (3) of the three port structure (1),
combining the RF signals supplied to the first and second input in the three port structure (1), and
outputting (4) a signal representing the result of the combination to a power sensor unit (5),
wherein the RF signal from the local oscillator (8) is modulated (7) before it is supplied to the second input (3) of the three port structure (1).

12. Method according to claim 11, characterized in that in the modulation step (7) at least three different modulation states are generated within the time duration of one modulation state of the RF signal to be down converted such that at least three different combination signals are output to the power sensor unit (5) within the time duration of one modulation state of the RF signal to be down converted.

13. Method according to claim 12, characterized by the step of detecting (13) modulation states of the modulated RF signal supplied to the first input (2) of the three port structure (1) respectively on the basis of the at least three different combination signals output by the three port structure (1) during the time duration of one modulation state of the RF signal supplied to the first input (2) of the three port structure (1).

14. Method according to claim 1 characterized in that:

in the modulation step (7) modulation states with at least two different amplitudes and phases are generated.

15. Method according to claim 11, characterized in that in the modulation step (7) modulation states with equal amplitude and at least three different phase states are generated.

16. Method according to claim 11, characterized in that it the first and second input of the three port structure (1) are isolated (11).

* * * * *